United States Patent
Dobbs et al.

(10) Patent No.: US 6,891,347 B2
(45) Date of Patent: May 10, 2005

(54) COOLING FAN CONTROL BASED ON CABINET INTRUSION

(75) Inventors: Robert W. Dobbs, Granite Bay, CA (US); James K. Koch, Rocklin, CA (US); Jeremy I. Wilson, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 259 days.

(21) Appl. No.: 10/267,766

(22) Filed: Oct. 9, 2002

(65) Prior Publication Data

US 2004/0070932 A1 Apr. 15, 2004

(51) Int. Cl.[7] .............................................. H02P 1/04
(52) U.S. Cl. ...................... 318/471; 318/254; 318/461; 388/800; 388/806; 388/903; 388/934
(58) Field of Search ................................ 318/254, 461, 318/471; 388/800, 806, 815, 827, 822, 903, 907.5, 934

(56) References Cited

U.S. PATENT DOCUMENTS

| | | |
|---|---|---|
| 5,006,959 A | 4/1991 | Freige et al. |
| 5,410,448 A | 4/1995 | Barker, III et al. |
| 5,848,282 A | 12/1998 | Kang |
| 5,926,386 A * | 7/1999 | Ott et al. ..................... 700/70 |
| 5,996,898 A * | 12/1999 | Parker et al. ................ 236/51 |
| 6,010,399 A | 1/2000 | Lee et al. |
| 6,040,668 A * | 3/2000 | Huynh et al. ............... 318/471 |
| 6,145,102 A * | 11/2000 | Klein et al. .................. 714/47 |
| 6,151,213 A | 11/2000 | Ater et al. |
| 6,189,799 B1 * | 2/2001 | Parker et al. ................ 236/51 |
| 6,325,636 B1 * | 12/2001 | Hipp et al. .................. 439/61 |
| 6,349,385 B1 * | 2/2002 | Kaminski et al. ........... 713/300 |
| 6,380,704 B1 * | 4/2002 | Chin ......................... 318/268 |
| 6,414,828 B1 | 7/2002 | Zimmerman et al. |
| 6,414,843 B1 | 7/2002 | Takeda |

FOREIGN PATENT DOCUMENTS

JP            2001100865       4/2001

* cited by examiner

*Primary Examiner*—Rina Duda (57) ABSTRACT

Various systems and methods are provided for cooling a cabinet. In one embodiment, a method is provided that comprises the steps of controlling a speed of the at least one cooling fan in response to a temperature of the cabinet, and, controlling the speed of the at least one cooling fan in response to a position of an access panel relative to the cabinet.

11 Claims, 5 Drawing Sheets

COOLING FAN CONTROL BASED ON CABINET INTRUSION

BACKGROUND

In order to provide reliable online services, Internet service providers require server technology that is reliable, low cost, and presents minimal down time. In response to such requirements, computer manufacturers create servers that facilitate "hot plug" servicing. Hot plug servicing is service performed on a server or other computer system while the unit is plugged in and is operational. In a typical situation, hot plug servicing involves the opening or removal of one or more access panels to gain access to internal circuitry and other devices.

The opening or removal of one or more access panels in a typical server or computer system often disrupts or alters cooling airflow through the unit. To explain further, servers, computer systems, or other electronics devices often include cooling fans that create an airflow designed to remove heat generated by electronic components from the cabinet or enclosure that houses such components. The opening of an access panel often introduces a new avenue through which air flows, thereby altering or disrupting airflow patterns that exist within a cabinet when all access panels are closed. In the specific case of hot plug servicing, removal of an access panel may alter or disrupt airflow patterns, thereby resulting in inadequate cooling.

SUMMARY

In one embodiment of the present invention, a method is provided that comprises the steps of controlling a speed of the at least one cooling fan in response to the temperature of the cabinet, and controlling the speed of the at least one cooling fan in response to a position of an access panel relative to the cabinet.

In another embodiment, a system for cooling a cabinet is provided. In this respect, the system comprises at least one cooling fan, means for controlling a speed of the at least one cooling fan in response to the temperature of the cabinet, and, means for controlling the speed of the at least one cooling fan in response to a position of an access panel relative to the cabinet.

In yet another embodiment, another system for cooling a cabinet is provided. In this regard, the system comprises at least one cooling fan and a fan speed controller electrically coupled to the at least one cooling fan. The fan speed controller comprises a processor circuit having a processor and a memory. An intrusion sensor is electrically coupled to the fan speed controller. Speed control logic is stored in the memory and executable by the processor. The speed control logic comprises logic that causes a maximum drive signal to be applied to the at least one cooling fan to drive the at least one cooling fan at a maximum speed upon receipt of a signal from the intrusion sensor that indicates that an access panel on the cabinet is open.

In still another embodiment, another system for cooling a cabinet is provided. In this embodiment, the system comprises at least one cooling fan and an intrusion sensor electrically coupled to the at least one cooling fan and operatively coupled to an access panel of the cabinet. The intrusion sensor applies a maximum drive signal to the at least one cooling fan that drives the cooling fan at a maximum speed in response to an opening of the access panel. Also, at least one temperature sensor is electrically coupled to the at least one cooling fan.

In still another embodiment, yet another system for cooling a cabinet is provided. In this respect, the system comprises at least one cooling fan and a fan speed controller electrically coupled to the at least one cooling fan. The fan speed controller comprises a processor circuit having a processor and a memory. The system also includes at least one temperature sensor electrically coupled to the fan speed controller and speed control logic stored in the memory and executable by the processor. The speed control logic comprises logic that causes a first drive signal to be applied to the at least one cooling fan in response to a signal received from the at least one temperature sensor, the first drive signal driving the at least one cooling fan at a predefined speed. Also, an intrusion sensor is electrically coupled to the at least one cooling fan. The intrusion sensor applies a second drive signal to the at least one cooling fan that drives the at least one cooling fan at a maximum speed, wherein the second drive signal overrides the first drive signal.

DETAILED DESCRIPTION

Figure 1A:
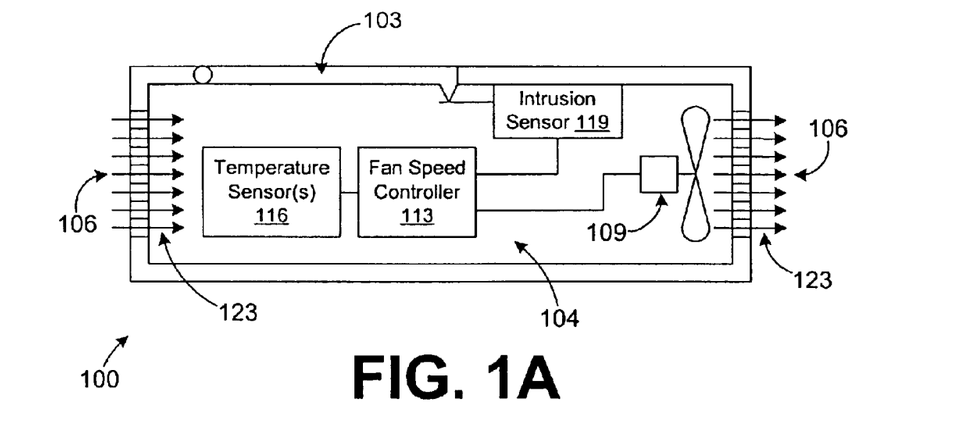
FIG. 1A is a drawing of a cabinet that includes a cabinet cooling system according to an embodiment of the present invention.

With reference to FIG. 1, shown is a cabinet 100 that serves as the housing for a server, computer system, or other device according to an embodiment of the present invention. In this respect, the cabinet 100 may house various components such as circuit boards, hard disk drives, power circuitry, and other electronic and mechanical components that are typically found in a server or computer system, etc. The cabinet 100 includes an access panel 103 that provides service access to the components housed within the cabinet 100. Also, the cabinet 100 also includes vents 106 that facilitate the passage of cooling air into and out of the cabinet 100.

In addition, a cooling system 104 is located within the cabinet 100 according to an embodiment of the present invention. The cooling system 104 includes one or more cooling fans 109, a fan speed controller 113, one or more temperature sensors 116, and at least one intrusion sensor 119. The one or more temperature sensors 116 are electrically coupled to the fan speed controller 113 and provide temperature signals thereto. The fan speed controller 113 is electrically coupled to the one or more cooling fans 109 and generates drive signals that are applied thereto. The intrusion sensor 119 is electrically coupled to an input of the fan speed controller 113 and is also operatively coupled to the access panel 103 so as to detect when the access panel 103 is opened or removed.

During operation of the server, computer system, or other device housed within the cabinet 100, the cooling system 104 serves to generate a cooling air flow 123 that circulates through the cabinet 100, where the cooling air flow enters and exits the cabinet 100 through the vents 106. In creating the cooling airflow 123, the cooling system 104 may employ multiple cooling fans 109 that draw air into the cabinet 100 or force air out of the cabinet 100 as can be appreciated by those with ordinary skill in the art. As is often the case, the components such as circuit boards and the like that are housed within the cabinet 100 may be positioned so as to direct or otherwise be exposed to the cooling the air flow 123 that circulates through the cabinet 100 so as to achieve optimal cooling.

The intrusion sensor 119 may be, for example, an interlock, an optical switch, a limit switch, a position sensor, a proximity sensor, or other appropriate sensor that senses a position of the access panel 103 relative to the cabinet 100. The cooling fans 109 may be, for example, a DC cooling fan cooling fan or other type of cooling fan. The fan speed controller 113 may be, for example, an analog controller or a digital controller. In the case that the fan speed controller 113 is a digital controller, then it may employ, for example, a processor circuit or other digital circuit.

Next, a brief discussion of the operation of the cooling system 104 within the cabinet 100 is provided. Given that the various circuit components within the cabinet 100 are operational, an amount of heat is generated within the cabinet 100. If the cabinet 100 becomes overheated, damage may result to circuit components or other devices in housed in the cabinet 100. In order to prevent the overheating of the cabinet 100, the cooling system 104 serves to establish the cooling air flow 123. To establish the cooling air flow 123, the fan speed controller 113 causes the one or more cooling fans 109 to operate at various speeds based upon the need for cooling within the cabinet 100 at a given time. Specifically, the fan speed controller 113 provides for the control of the speed of the one or more cooling fans 109 within the cabinet 100 in response to the temperature of the cabinet 100.

To explain further, the temperature sensors 116 generate temperature signals in response to the temperature of the cabinet 100. These temperature signals are provided to the fan speed controller 113. The temperature signals indicate the temperature sensed in the cabinet 100 by the temperature sensors 116. In response, the fan speed controller 113 generates one or more drive signals that are applied to the one or more cooling fans 109. The each drive signal applied to each cooling fan 109 drives the respective cooling fan 109 at a predefined rate of speed. In this manner, the fan speed controller 113 drives the speed of the one or more cooling fans 109 to provide for more or less cooling air flow 123 through the cabinet 100 to maintain the temperature within the cabinet 100 at an optimum level for proper operation of the circuit components and other devices housed therein.

Each of the cooling fans 109 may also include a tachometer that generates a feedback signal that indicates a speed of the cooling fan 109, respectively. The output of such a tachometer is applied to the fan speed controller 113, thereby informing the fan speed controller 113 as to the actual speed of the cooling fans 109.

In addition, the fan speed controller 113 also provides for controlling the speed of the at least one cooling fan 109 in response to a position of an access panel 103 relative to the cabinet 100. To accomplish this, the intrusion sensor 119 generates a signal that is applied to the fan speed controller 113. For example, the intrusion sensor 119 generates the signal in response to an opening or removal of the access panel 103. In this regard, the intrusion sensor 119 informs the fan speed controller 113 when the access panel 103 has been opened or removed. The signal generated by the intrusion sensor 119 may be any type of signal (or lack of a signal) that is recognized by the fan speed controller 113.

In response to the receipt of the signal from the intrusion sensor 119 indicating that the access panel 103 has been opened removed, the fan speed controller 113 generates one are more drive signals that are applied to the one or more cooling fans 109. The drive signals generated in this manner drive the cooling fans 109 at a predefined speed or revolutions per minute (RPM). The predefined speed may be any speed that results in adequate cooling air flow 123 through the cabinet 100 with the access panel 103 opened or removed. In one embodiment, the drive signals drive the at least one cooling fan at a maximum speed to provide a maximum air flow through the cabinet 100. This is due to the fact that the air flow dynamics within the cabinet 100 have been altered or disrupted due to the opening or removal of the access panel 103. The maximum speed provides for maximum air flow to compensate for such alteration or disruption.

Figure 1B:
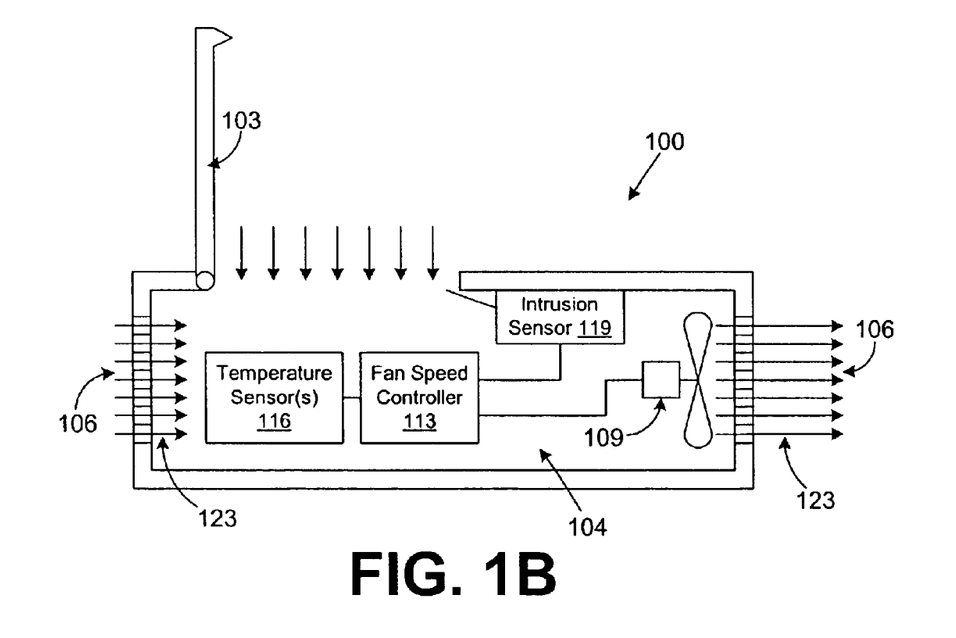
FIG. 1B is a drawing of the cabinet of FIG. 1A with an open access panel.

Turn then to FIG. 1B, shown is a second view of the cabinet 100 according to an embodiment of the present invention. As shown, the access panel 103 is in an open position, thereby allowing a certain amount of air to flow into the cabinet 100 through the void left by the opening or removal of the access panel 103. Since the intrusion sensor 119 senses the fact that the access panel 103 has been opened or removed, the intrusion sensor 119 sends the appropriate signal to the fan speed controller 113. In response, the fan speed controller 113 drives the one or more cooling fans 109 at a predefined speed. Assuming the predefined speed to be increased with respect to the prior operating speed, the air flow is correspondingly increased. This is done to ensure that air flows through the vents 106 as well as the opening created by the opening or removal of the access panel 103.

Figure 2:
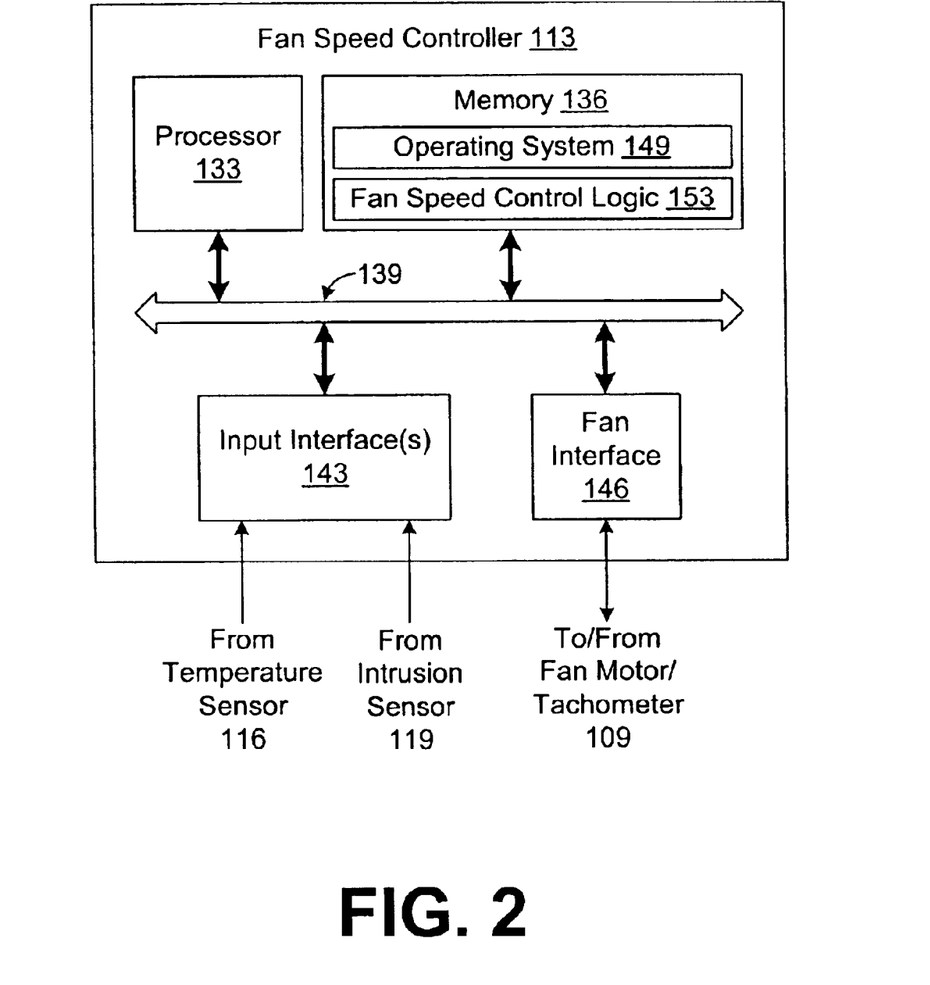
FIG. 2 is an exemplary schematic of a fan speed controller employed in the cabinet cooling system of FIG. 1 according to an embodiment of the present invention.

Turning then to FIG. 2, shown is one embodiment of the fan speed controller 113 according to an embodiment of the present invention. The fan speed controller 113 includes a processor circuit having a processor 133 and a memory 136, both of which are coupled to a local interface 139. In this respect, the local interface 139 may be, for example, a data bus with an accompanying control/address bus as can be appreciated by those with ordinary skill in the art. In this respect, the processor circuit may be, for example, a microprocessor circuit or other appropriate device. The fans speed controller 113 also includes one or more input interfaces 143 and one or more fan interfaces 146. The input interfaces 143 provide for the input of appropriate signals from the temperature sensors 116 and the intrusion sensor 119. Likewise, and the fan interface 146 provides for the transmission of drive signals generated by the fan speed controller 113 to the one or more cooling fans 109.

The stored in the memory of 136 and executed by the processor 133 are an operating system 149 and fan speed control logic 153. The fan speed control logic 153 is executed by the processor 133 in order to control the speed of the cooling fans 109 as will be described.

The memory 136 is defined herein as both volatile and nonvolatile memory and data storage components. Volatile components are those that do not retain data values upon loss of power. Nonvolatile components are those that retain data upon a loss of power. Thus, the memory 136 may comprise, for example, random access memory (RAM), read-only memory (ROM), hard disk drives, floppy disks accessed via an associated floppy disk drive, compact discs accessed via a compact disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

In addition, the processor 133 may represent multiple processors and the memory 136 may represent multiple memories that operate in parallel. In such a case, the local interface 139 may be an appropriate network that facilitates communication between any two of the multiple processors, between any processor and any one of the memories, or between any two of the memories etc. The processor 133 may be electrical or optical in nature.

The operating system 149 is executed to control the allocation and usage of hardware resources in the fan speed controller 113 such as the memory, processing time and peripheral devices. In this manner, the operating system 149 serves as the foundation on which applications depend as is generally known by those with ordinary skill in the art.

Figure 3:
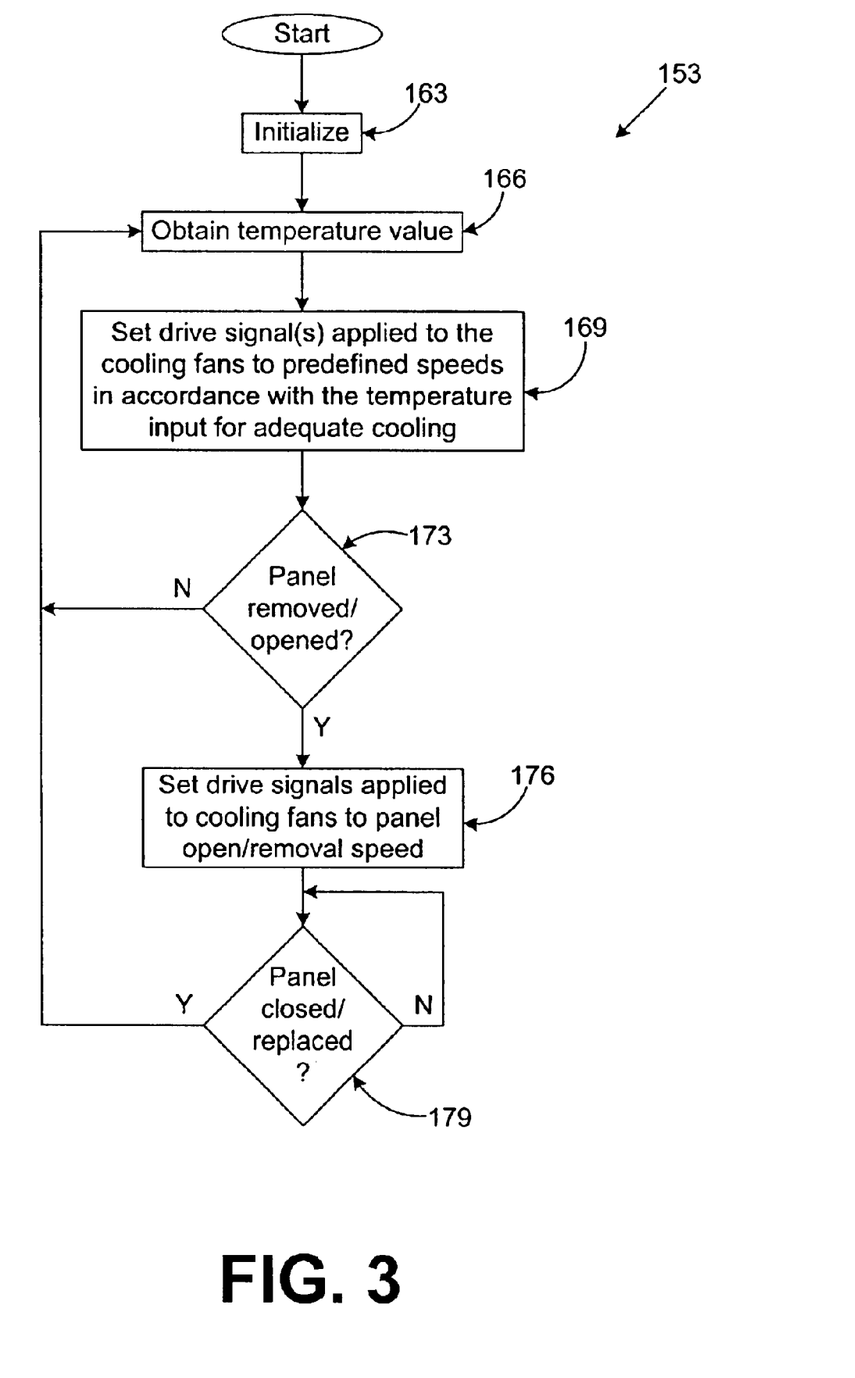
FIG. 3 is an exemplary flow chart of fan speed control logic executed by the fan speed controller of FIG. 2 according to an embodiment of the present invention.

With reference to FIG. 3, shown is an exemplary flow chart of the fan speed control logic 153 according to an embodiment of the present invention. Alternatively, the flow chart of FIG. 3 may be viewed as depicting steps of a method implemented in the fan speed controller 113 (FIG. 2).

Beginning with block 163, the fan speed control logic 153 initializes. In this respect, all variables are set to initial values and other initialization tasks are undertaken as can be appreciated by those with ordinary skill in the art. Thereafter, in box 166 one or more temperature values are obtained from the temperature sensors 116 (FIG. 1A). Next, in box 169 the fan speed control logic 153 sets the fan drive signal(s) to predetermined magnitudes better designed to drive the cooling fans 109 (FIG. 1A) at predetermined speed or number of resolutions per second. Thereafter, in box 173, the fan speed control logic 153 determines whether the access panel 103 (FIG. 1A) has been opened or removed. Note that this determination is made by examining the input from the intrusion sensor 119 (FIG. 1A). If the access panel 103 has been opened or removed as determined in box 173, then the fan speed control logic 153 proceeds to box 176 in which the fan speed controller 113 sets the drive signal(s) that is/are applied to the cooling fan(s) 109 the panel open/removal speed. If the access panel 103 has not been opened or removed in box 173, then the fan speed control logic 153 reverts back to box 166.

In one embodiment, the panel open/removal speed is a maximum speed of the cooling fan(s) 109, however, any predefined speed may be employed as the panel open/removal speed. Thereafter, in box 179 the fan speed control logic 153 determines whether the previously opened/removed access panel 103 has been closed or replaced. If not, then the fan speed control logic 153 waits at box 179 until the closing or replacement of the access panel 103 is detected. The detection of a closure or replacement of the access panel 103 is determined by examining an input received from the intrusion sensor 119. Assuming that the fan speed control logic 153 detects that the access panel 103 has been closed or replaced, the fan speed control logic 153 reverts back to box 166.

Thus, the fan speed control logic 153 continually obtains temperatures from the temperature sensors 116 within the cabinet 100 to determine if the level cooling necessary to prevent overheating in the cabinet 100 and drives the cooling fans 109 accordingly. This loop is uninterrupted until the access panel 103 is opened or removed at which time the fan speed control logic 153 operates the cooling fans 109 at the panel open/removal speed until the access panel 103 is closed or replaced. In addition, it is understood that the fan speed control logic 153 can include other functionality not described herein.

Although the fan speed control logic 153 is embodied in software or code executed by processor circuit as discussed above, as an alternative the fan speed control logic 153 may also be embodied in dedicated hardware or a combination of software/general purpose hardware and dedicated hardware. If embodied in dedicated hardware, the fan speed control logic 153 can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, programmable gate arrays (PGA), field programmable gate arrays (FPGA), or other components, etc. Such technologies are generally well known by those skilled in the art and, consequently, are not described in detail herein.

The flow chart of FIG. 3 shows the architecture, functionality, and operation of an implementation of the fan speed control logic 153. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor in a computer system or other system. The machine code may be converted from the source code, etc. If embodied in hardware, each block may represent a circuit or a number of interconnected circuits to implement the specified logical function(s).

Although the flow chart of FIG. 3 shows a specific order of execution, it is understood that the order of execution may differ from that which is depicted. For example, the order of execution of two or more blocks may be scrambled relative to the order shown. Also, two or more blocks shown in succession in FIG. 3 may be executed concurrently or with partial concurrence. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present invention.

Also, where the fan speed control logic 153 comprises software or code, it can be embodied in any computer-readable medium for use by or in connection with an instruction execution system such as, for example, a processor in a computer system or other system. In this sense, the fan speed control logic 153 may comprise, for example, statements including instructions and declarations that can be fetched from the computer-readable medium and executed by the instruction execution system. In the context of the present invention, a "computer-readable medium" can be any medium that can contain, store, or maintain the fan speed control logic 153 for use by or in connection with the instruction execution system. The computer readable medium can comprise any one of many physical media such as, for example, electronic, magnetic, optical, electromagnetic, infrared, or semiconductor media. More specific examples of a suitable computer-readable medium would include, but are not limited to, magnetic tapes, magnetic floppy diskettes, magnetic hard drives, or compact discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

Figure 4:
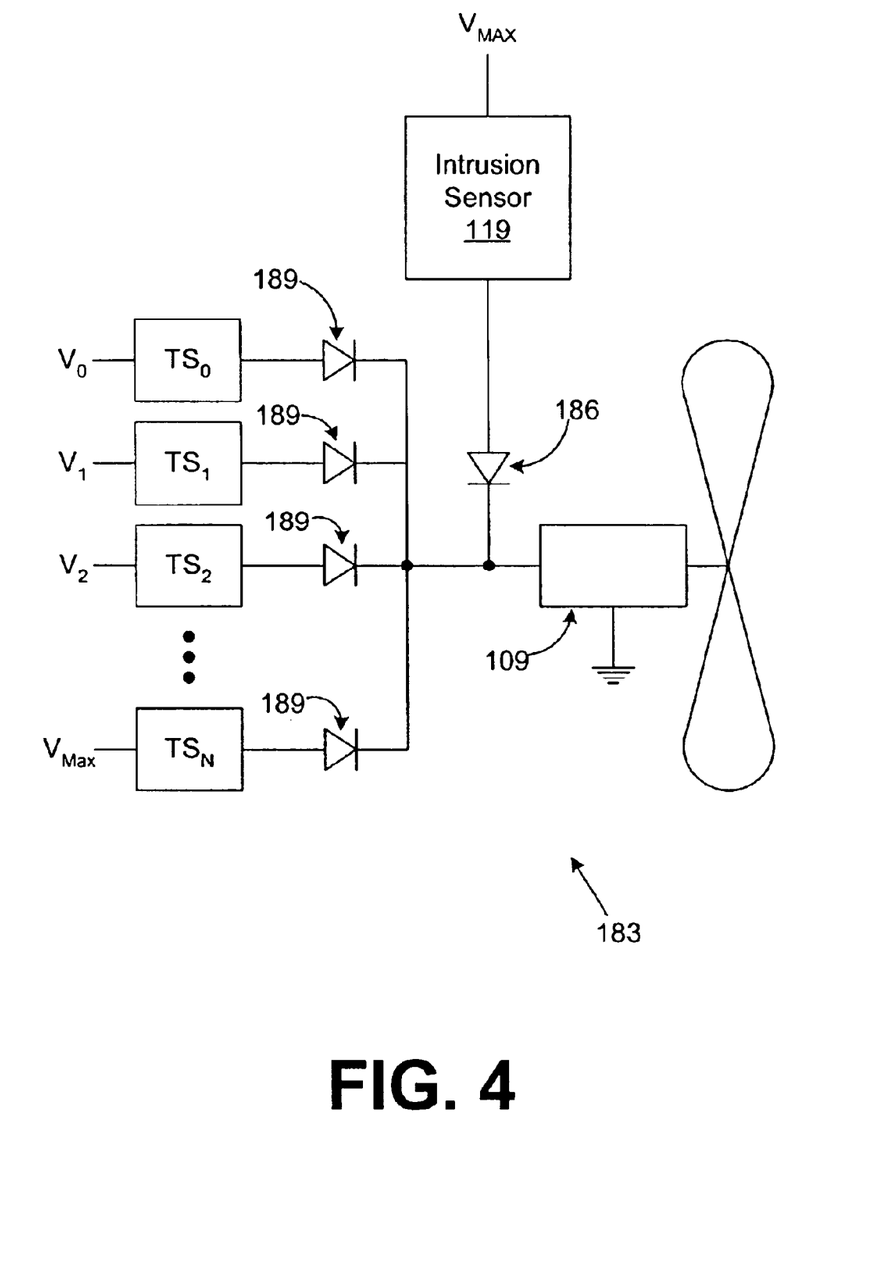
FIG. 4 is an exemplary schematic of a second cabinet cooling system according to another embodiment of the present invention.

Referring next to FIG. 4, shown is an exemplary schematic of a cooling system 183 according to another embodiment of the present invention. The cooling system 183 includes an intrusion sensor 119 that is electrically coupled directly to the one or more cooling fans 109 through a first diode 186. In addition, a number of temperature sensors $TS_{0-N}$ are coupled directly to the cooling fan 109 through a number of second diodes 189. In this respect, the outputs of the diodes 186 and 189 are coupled together at a common node that is coupled directly to the cooling fan(s) 109.

The intrusion sensor 119 includes a power input to which a maximum voltage $V_{MAX}$ is applied. The intrusion sensor 119 applies the maximum voltage $V_{MAX}$ to the cooling fan(s) 109 as a drive signal that drives the cooling fan(s) 109 at a maximum speed or revolutions per minute. Similarly, a number of voltages $V_0-V_{MAX}$ are applied to the temperature sensors $TS_{0-N}$. The temperature sensors $TS_{0-N}$ apply the voltages $V_0-V_{MAX}$ to the cooling fan(s) 109 as drive signals that drive the cooling fan(s) 109 at predefined speeds or revolutions per second. The diodes 186 and 189 isolate the intrusion sensor 119 and each of the temperature sensors $TS_{0-N}$ from the higher voltage outputs of the remaining ones of the intrusion sensor 119/temperature sensors $TS_{0-N}$. In a sense, a drive signal generated by any one of the intrusion sensor 119/temperature sensors $TS_{0-N}$ overrides any drive signals of a lesser magnitude generated by the remaining ones of the intrusion sensor 119/temperature sensors $TS_{0-N}$.

Figure 5:
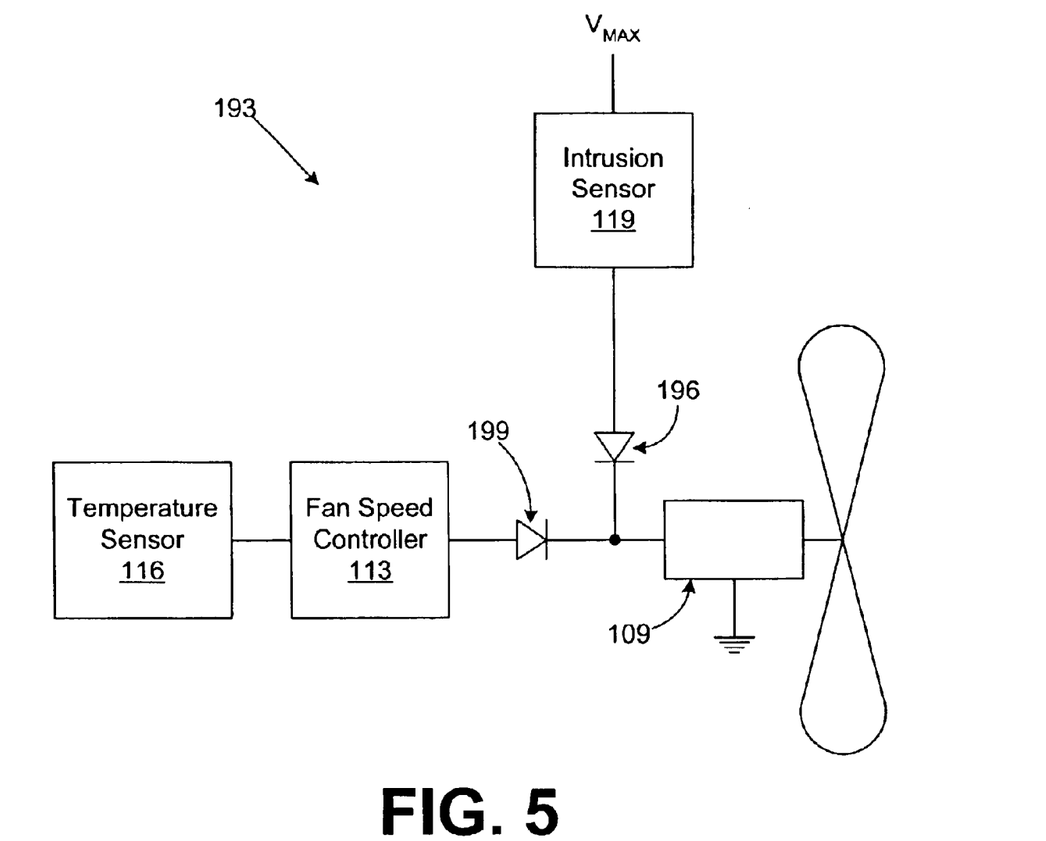
FIG. 5 is an exemplary schematic of a third cabinet cooling system according to yet another embodiment of the present invention.

With reference to FIG. 5, shown is an exemplary schematic of a cooling system 193 according to yet another embodiment of the present invention. The cooling system 193 includes the intrusion sensor 119, the fan speed controller 113 and one or more temperature sensors 116. The temperature sensors 116 are electrically coupled to the fan speed controller 113 in a similar manner as was discussed with reference to FIG. 1A. The intrusion sensor 119 is electrically coupled to one or more cooling fans 109 through a first diode 196. Similarly, the fan speed controller 113 includes a drive signal output that is coupled to the one or more cooling fans 109 through a second diode 199. Similarly as discussed with reference to FIG. 4, a maximum drive voltage $V_{MAX}$ is applied to the intrusion sensor 119. The intrusion sensor 119 applies the drive voltage $V_{MAX}$ to the one or more cooling fans 119 as a drive signal. In this respect, the drive signal may drive the one or more cooling fans 109 at a maximum speed or revolutions per minute or at some other speed as is appropriate as was previously discussed. Similarly, the fan speed controller 113 generates an appropriate drive signal that is applied to the one or more cooling fans 109 through the second diode 199 to drive the one or more cooling fans 109 at an appropriate speed depending upon the cooling needed to maintain the proper temperature within the cabinet 100 (FIG. 1A).

Due to the fact that the intrusion sensor 119 is electrically coupled directly to the one or more cooling fans 109 through the first diode 196, then the drive signal generated by the intrusion sensor 119 that is applied to the one or more cooling fans 109 overrides any drive signal generated by the fan speed controller 113. This assumes that the voltage of the drive signal from the intrusion sensor 119 is greater in magnitude than the voltage of the drive signal from the fan speed controller 113. It is understood that other circuits may be employed to allow the intrusion sensor 119 to override or bypass any drive signal generated by the fan speed controller 113 beyond the circuit described with reference to FIG. 5.

Thus, the cooling system 193 provides an example of where the intrusion sensor 119 is retrofitted to an existing cooling system 193 that operates without sensing whether the access panel 103 (FIG. 1A) is opened/removed or closed/in place.

Although the invention is shown and described with respect to certain embodiments, the invention may be otherwise embodied and the appended claims are to be construed to cover the described embodiments and all alternative embodiments except to the extent limited by the prior art.

What is claimed is:

1. A method for cooling a cabinet, comprising:
    controlling a speed of the at least one cooling fan in the cabinet in response to a temperature of the cabinet;
    controlling the speed of the at least one cooling fan in response to a position of an access panel relative to the cabinet; and
    providing an intrusion sensor that applies a drive signal to the at least one cooling fan in response to an opening of the access panel, wherein the intrusion sensor is electrically coupled to the at least one cooling fan through a diode.

2. The method of claim 1, further comprising driving the at least one cooling fan at a maximum speed with the drive signal.

3. A system for cooling a cabinet, comprising:
    at least one cooling fan;
    means for controlling the speed of the at least one cooling fan in response to the temperature of the cabinet, comprising:
        a fan speed controller;
        at least one temperature sensor electrically coupled to a fan speed controller; and
        the fan speed controller being electrically coupled to the at least one cooling fan through a first diode; and
    means for controlling the speed of the at least one cooling fan in response to the position of the access panel relative to the cabinet, comprising an intrusion sensor that is electrically coupled to the at least one cooling fan through a second diode.

4. A system for cooling a cabinet, comprising:
    at least one cooling fan;
    means for controlling a speed of the at least one cooling fan in response to a temperature of the cabinet; and
    means for controlling the speed of the at least one cooling fan in response to a position of an access panel relative to the cabinet having an intrusion sensor that is electrically coupled to the at least one cooling fan through a diode.

5. The system of claim 4, wherein the intrusion sensor applies a drive signal to the at least one cooling fan that drives the at least one cooling fan at a maximum speed.

6. A system for cooling a cabinet, comprising:

at least one cooling fan;

a fan speed controller electrically coupled to the at least one cooling fan through a first diode, the fan speed controller comprising a processor circuit having a processor and a memory;

an intrusion sensor electrically coupled to the at least one cooling fan through a second diode; and speed control logic stored in the memory and executable by the processor, the speed control logic comprising logic that causes a maximum drive signal to be applied to the at least one cooling fan to drive the at least one cooling fan at a maximum speed upon receipt of a signal from the intrusion sensor that indicates that an access panel on the cabinet is open.

7. A system for cooling a cabinet, comprising:

at least one cooling fan;

a fan speed controller electrically coupled to the at least one cooling fan through a first diode, the fan speed controller comprising a processor circuit having a processor and a memory;

an intrusion sensor electrically coupled to the at least one cooling fan through a second diode;

at least one temperature sensor electrically coupled to the fan speed controller; and wherein the speed control logic further comprises logic that causes a drive signal to be applied to the at least one cooling fan in response to a signal received from the at least one temperature sensor, the drive signal driving the at least one cooling fan at a predefined speed.

8. A system for cooling a cabinet, comprising:

at least one cooling fan;

an intrusion sensor electrically coupled to the at least one cooling fan and operatively coupled to an access panel of the cabinet, wherein the intrusion sensor applies a maximum drive signal to the at least one cooling fan that drives the cooling fan at a maximum speed in response to an opening of the access panel, wherein the intrusion sensor is electrically coupled to the at least one cooling fan through a diode; and at least one temperature sensor electrically coupled to the at least one cooling fan.

9. The system of claim 8, wherein the maximum drive signal is a maximum drive voltage that is applied to an input of the intrusion sensor.

10. A system for cooling a cabinet, comprising:

at least one cooling fan;

an intrusion sensor electrically coupled to the at least one cooling fan and operatively coupled to an access panel of the cabinet, wherein the intrusion sensor applies a maximum drive signal to the at least one cooling fan that drives the cooling fan at a maximum speed in response to an opening of the access panel; and at least one temperature sensor electrically coupled to the at least one cooling fan, wherein the at least one temperature sensor is electrically coupled to the at least one cooling fan through a diode.

11. A system for cooling a cabinet, comprising:

at least one cooling fan;

a fan speed controller electrically coupled to the at least one cooling ran through a first diode, the fan speed controller comprising a processor circuit having a processor and a memory;

at least one temperature sensor electrically coupled to the fan speed controller;

speed control logic stored in the memory and executable by the processor, the speed control logic comprising logic that causes a first drive signal to be applied to the at least one cooling fan in response to a signal received from the at least one temperature sensor, the first drive signal driving the at least one cooling fan at a predefined speed; and an intrusion sensor electrically coupled to the at least one cooling fan through a second diode, the intrusion sensor applying a second drive signal to the at least one cooling fan that drives the at least one cooling fan at a maximum speed, wherein the second drive signal overrides the first drive signal.

* * * * *

UNITED STATES PATENT AND TRADEMARK OFFICE
CERTIFICATE OF CORRECTION

PATENT NO. : 6,891,347 B2  Page 1 of 1
APPLICATION NO. : 10/267766
DATED : May 10, 2005
INVENTOR(S) : Robert W. Dobbs et al.

It is certified that error appears in the above-identified patent and that said Letters Patent is hereby corrected as shown below:

Claim 11, Column 10, line 23, after "cooling" delete "ran" and insert therefor --fan--

Signed and Sealed this

Sixth Day of January, 2009

JON W. DUDAS
*Director of the United States Patent and Trademark Office*